United States Patent
Kim

(10) Patent No.: US 11,452,226 B2
(45) Date of Patent: Sep. 20, 2022

(54) ROBOT WITH THROUGH-HOLE TO RECEIVE PIN

(71) Applicant: LG ELECTRONICS INC., Seoul (KR)

(72) Inventor: Moonchan Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 291 days.

(21) Appl. No.: 16/606,599

(22) PCT Filed: Mar. 13, 2019

(86) PCT No.: PCT/KR2019/002903
§ 371 (c)(1),
(2) Date: Oct. 18, 2019

(87) PCT Pub. No.: WO2020/184756
PCT Pub. Date: Sep. 17, 2020

(65) Prior Publication Data
US 2021/0337693 A1   Oct. 28, 2021

(51) Int. Cl.
| H05K 7/14 | (2006.01) |
| B25J 9/00 | (2006.01) |
| F16M 11/22 | (2006.01) |
| H05K 1/18 | (2006.01) |
| H05K 5/03 | (2006.01) |

(52) U.S. Cl.
CPC .......... *H05K 7/1427* (2013.01); *B25J 9/0009* (2013.01); *F16M 11/22* (2013.01); *H05K 1/181* (2013.01); *H05K 5/03* (2013.01); *H05K 2201/10053* (2013.01)

(58) Field of Classification Search
CPC .......... H05K 5/03; H05K 1/181; H05K 7/1427
See application file for complete search history.

(56) References Cited

U.S. PATENT DOCUMENTS 5,293,809 A * 3/1994 Van Der Heijden ........................ B29C 66/93441
901/29
5,626,216 A * 5/1997 Sperling ................ B23K 9/287
192/56.62

(Continued)

FOREIGN PATENT DOCUMENTS

| CN | 205928682 | 2/2017 |
| CN | 206795835 | 12/2017 |

(Continued)

OTHER PUBLICATIONS

International Search Report dated Dec. 12, 2019 issued in Application No. PCT/KR2019/002903.

*Primary Examiner* — Rockshana D Chowdhury
*Assistant Examiner* — Douglas R Burtner
(74) *Attorney, Agent, or Firm* — Ked & Associates, LLP

(57) ABSTRACT

A robot comprises: an outer body in which a pin through-hole is formed; a cover from which a pin passing through the pin through-hole protrudes and in which a protrusion is formed at one side of the pin; and a stopper disposed at an outer circumference of the pin, wherein the stopper comprises: a protrusion contact surface on which the protrusion is contacted and caught; and an outer body contact surface that is contacted and caught by a periphery of the pin through-hole in the outer body.

20 Claims, 14 Drawing Sheets

(56) References Cited

U.S. PATENT DOCUMENTS

| | | | | |
|---|---|---|---|---|
| 5,915,506 | A * | 6/1999 | Farina | B25J 19/063 |
| | | | | 901/49 |
| 6,346,751 | B1 * | 2/2002 | Delfino | B25J 19/063 |
| | | | | 307/119 |
| 10,542,667 | B2 * | 1/2020 | Song | A01D 34/008 |
| 10,555,457 | B2 * | 2/2020 | Song | A01D 34/828 |
| 10,716,254 | B2 * | 7/2020 | Song | A01D 34/736 |
| 10,759,045 | B2 * | 9/2020 | Yang | B25J 11/008 |
| 11,077,546 | B2 * | 8/2021 | Jung | B25J 5/007 |
| 11,096,325 | B2 * | 8/2021 | Song | A01D 34/008 |
| 11,298,835 | B2 * | 4/2022 | Kim | B25J 9/16 |
| 2005/0016008 | A1 * | 1/2005 | Raab | G01B 11/005 |
| | | | | 33/503 |
| 2015/0030376 | A1 * | 1/2015 | Shimazawa | F16C 11/0671 |
| | | | | 403/134 |
| 2016/0338213 | A1 * | 11/2016 | Dupart | H05K 5/0208 |
| 2018/0091901 | A1 | 3/2018 | Stanley et al. | |
| 2018/0241915 | A1 * | 8/2018 | Guan | H04N 5/23238 |
| 2018/0271604 | A1 * | 9/2018 | Grout | A61B 90/57 |
| 2019/0009417 | A1 * | 1/2019 | Ogata | B25J 9/0009 |
| 2019/0348232 | A1 * | 11/2019 | Chen | H01H 3/12 |
| 2019/0389051 | A1 * | 12/2019 | Kim | B25J 9/0003 |
| 2020/0030963 | A1 * | 1/2020 | Youn | B25J 9/0009 |
| 2020/0086503 | A1 * | 3/2020 | Johnson | B25J 19/0083 |
| 2020/0238503 | A1 * | 7/2020 | Kume | B25J 9/0009 |
| 2021/0009208 | A1 * | 1/2021 | Jung | B25J 19/00 |
| 2021/0166592 | A1 * | 6/2021 | Kang | G09F 7/20 |
| 2021/0329841 | A1 * | 10/2021 | Cuong | A01D 69/02 |
| 2021/0332935 | A1 * | 10/2021 | Kim | F16M 11/10 |

FOREIGN PATENT DOCUMENTS

| | | |
|---|---|---|
| KR | 10-2006-0019647 | 3/2006 |
| KR | 10-2018-0079826 | 7/2018 |

* cited by examiner

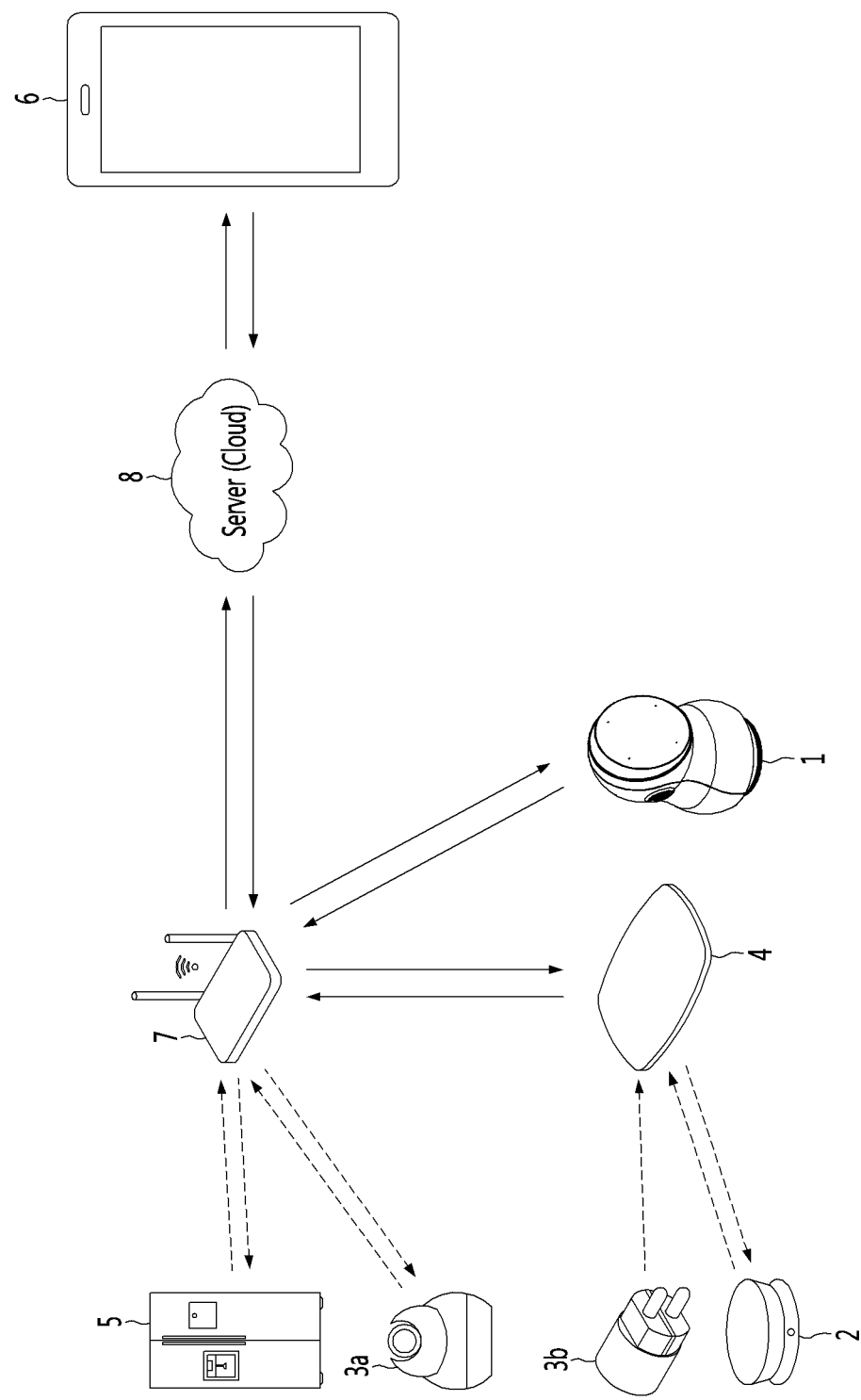
[Fig. 1]

[Fig. 2]
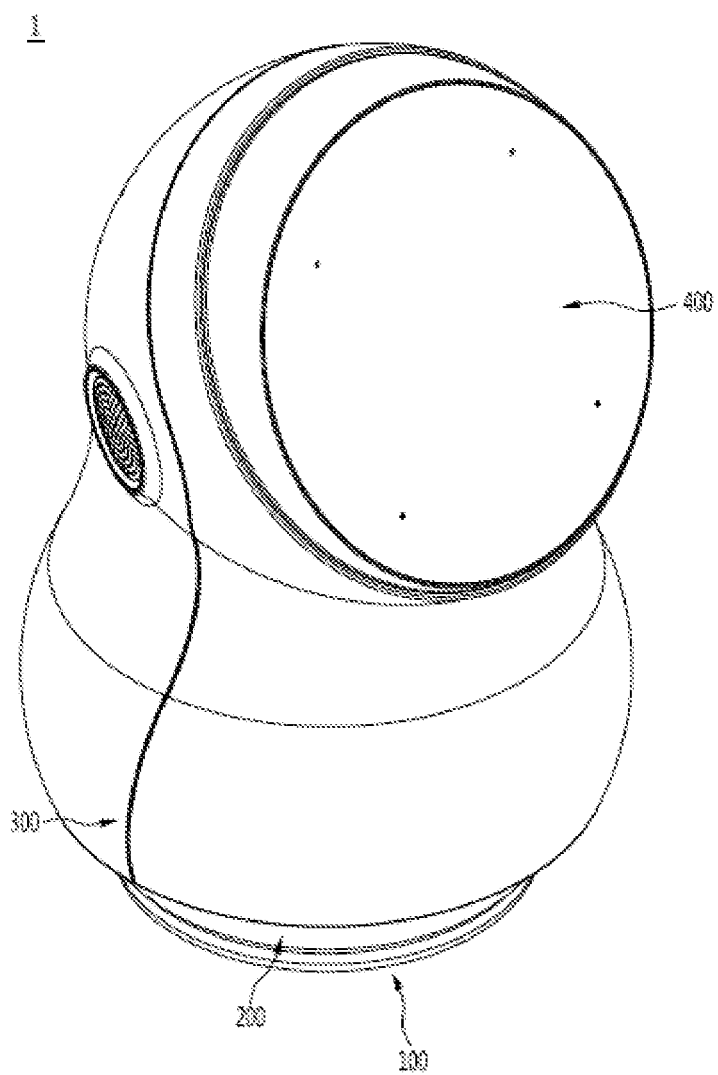

[Fig. 3]
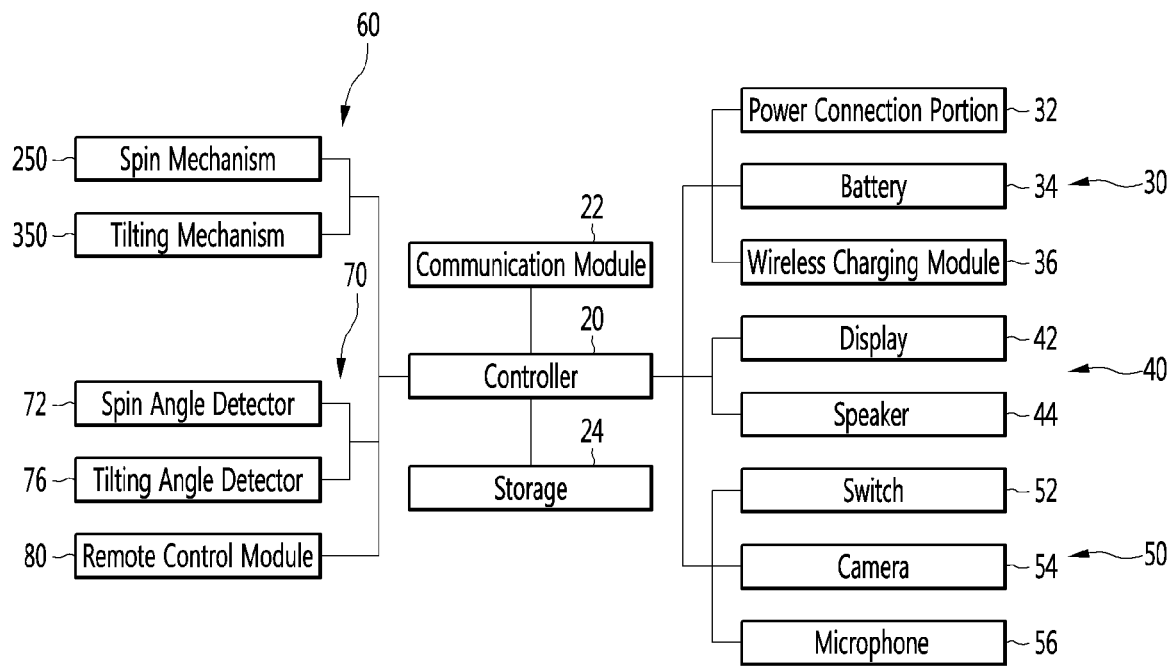

[Fig. 4]
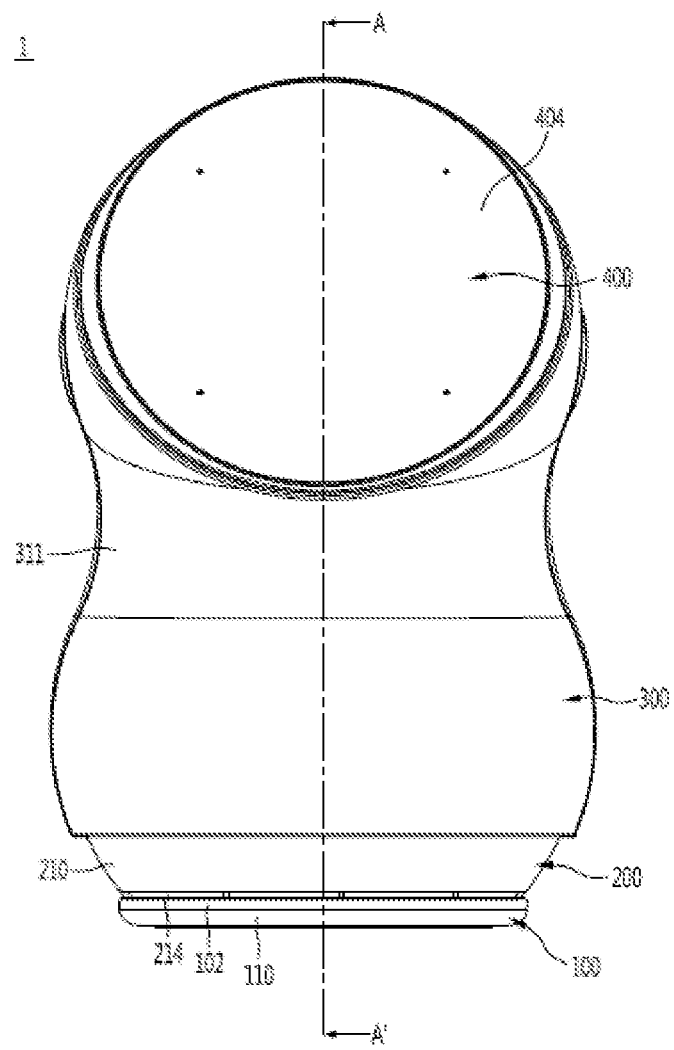

[Fig. 5]
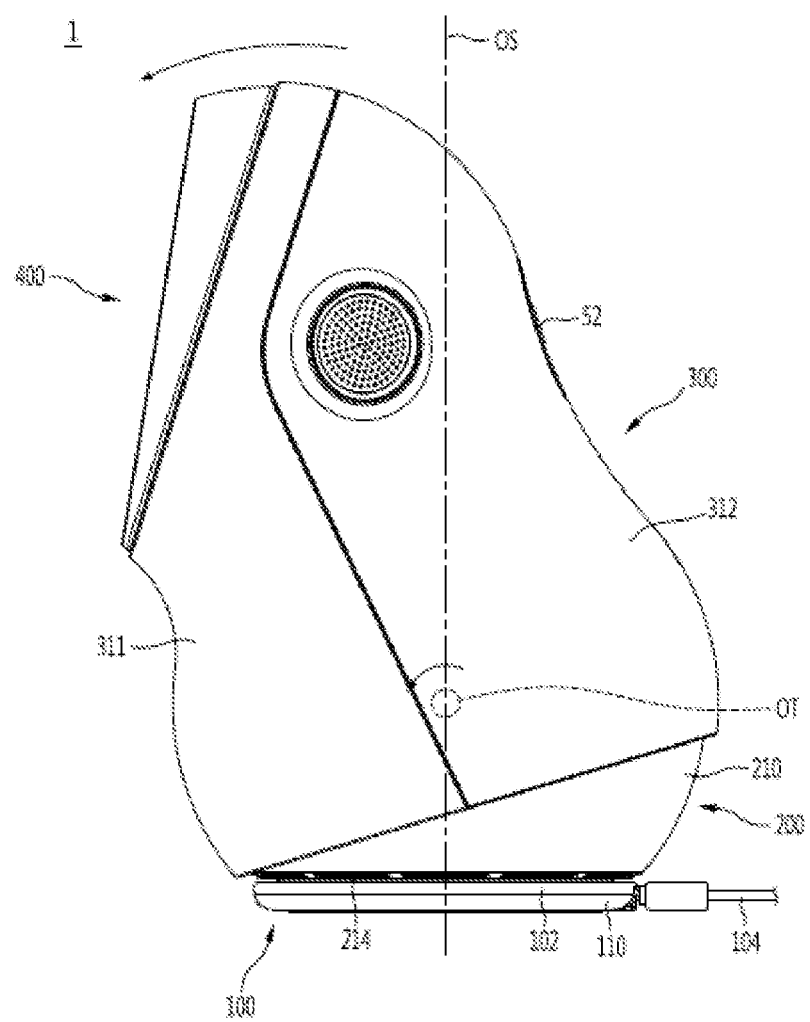

【Fig. 6】
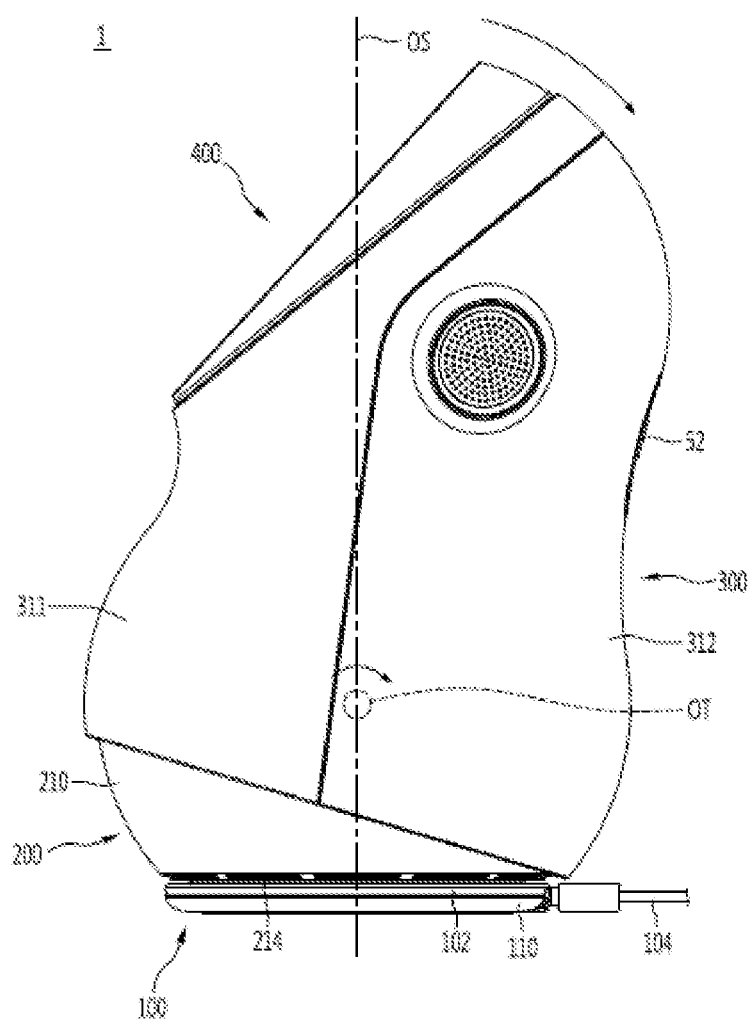

[Fig. 7]
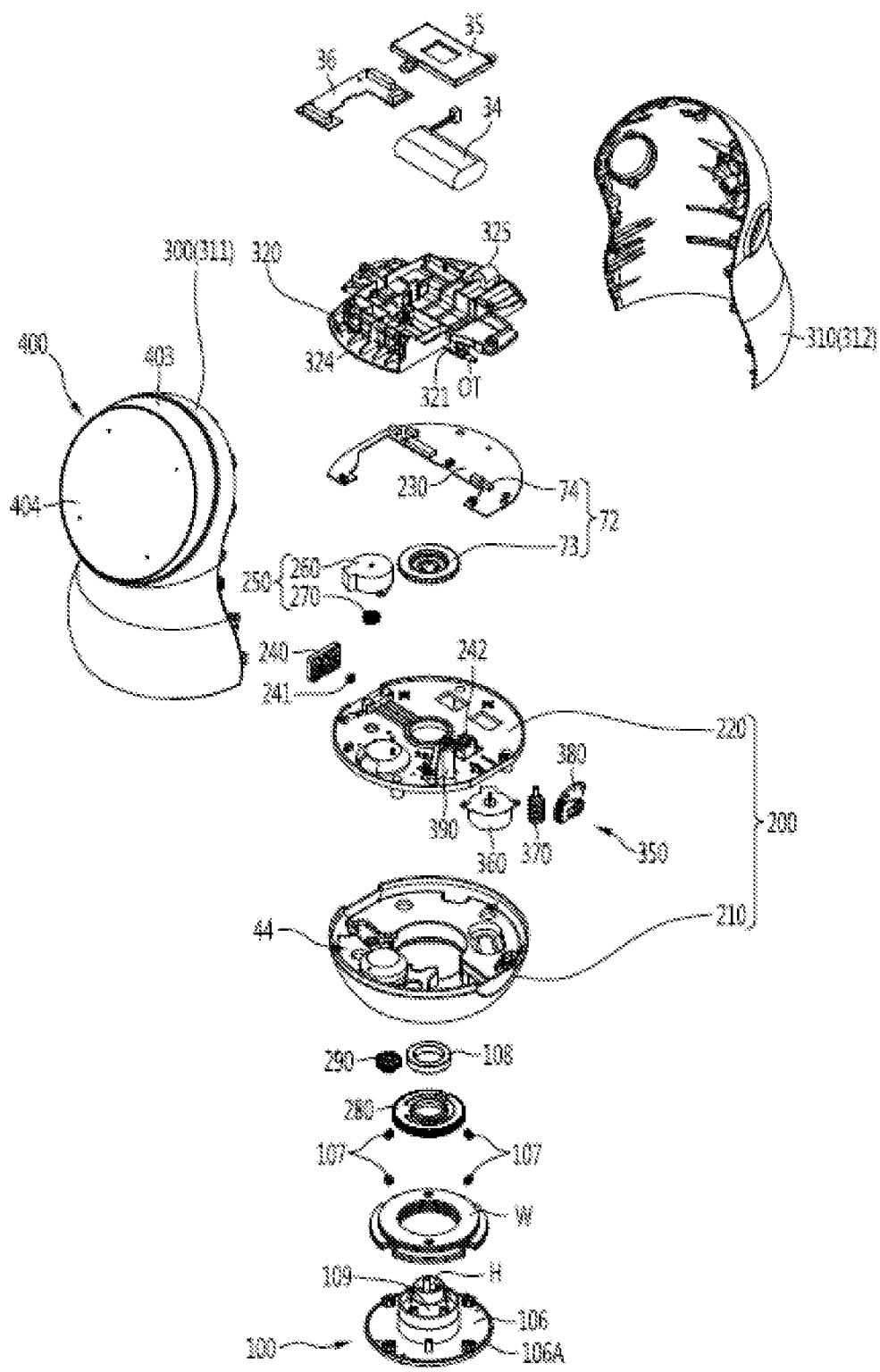

[Fig. 8]
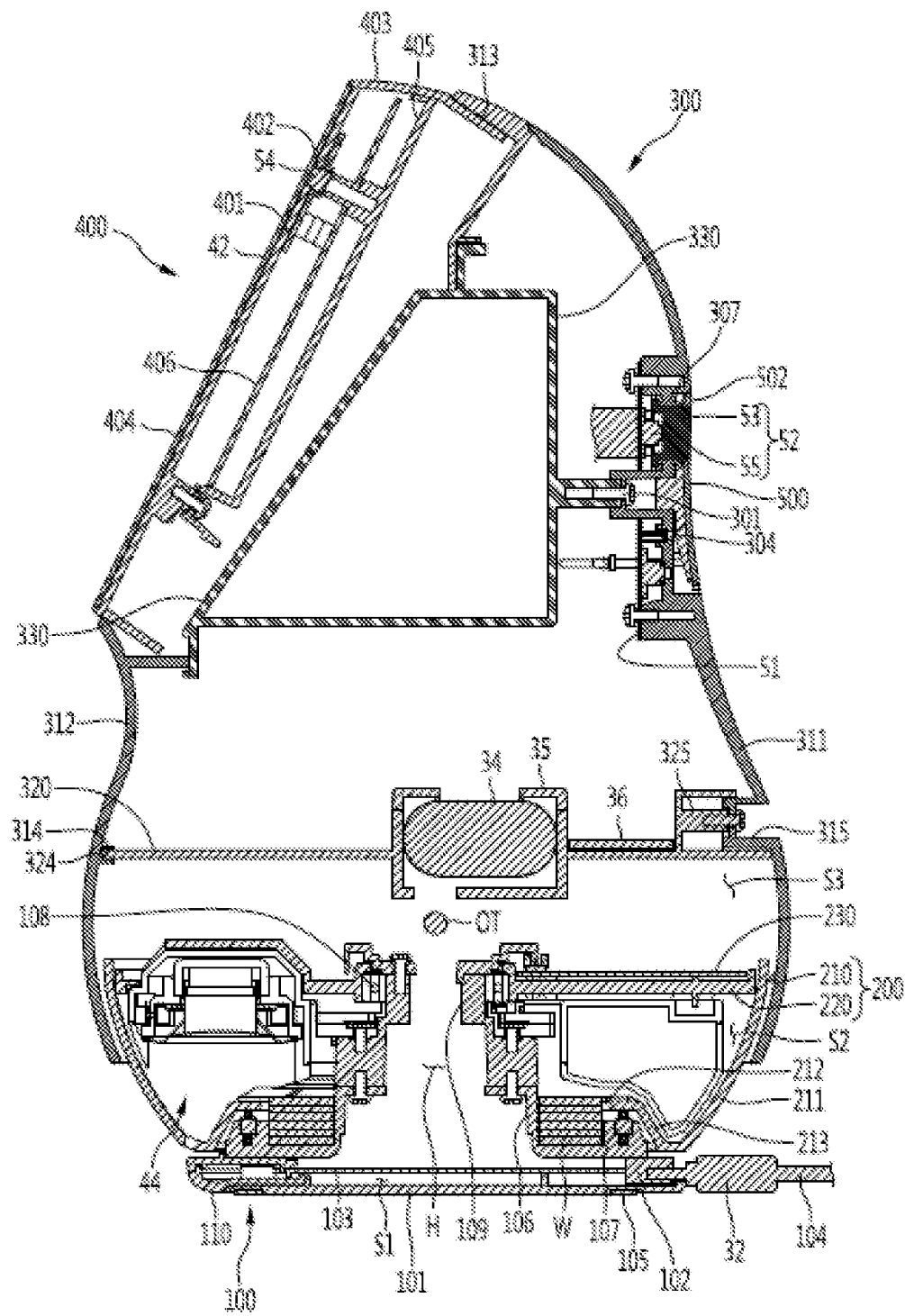

[Fig. 9]
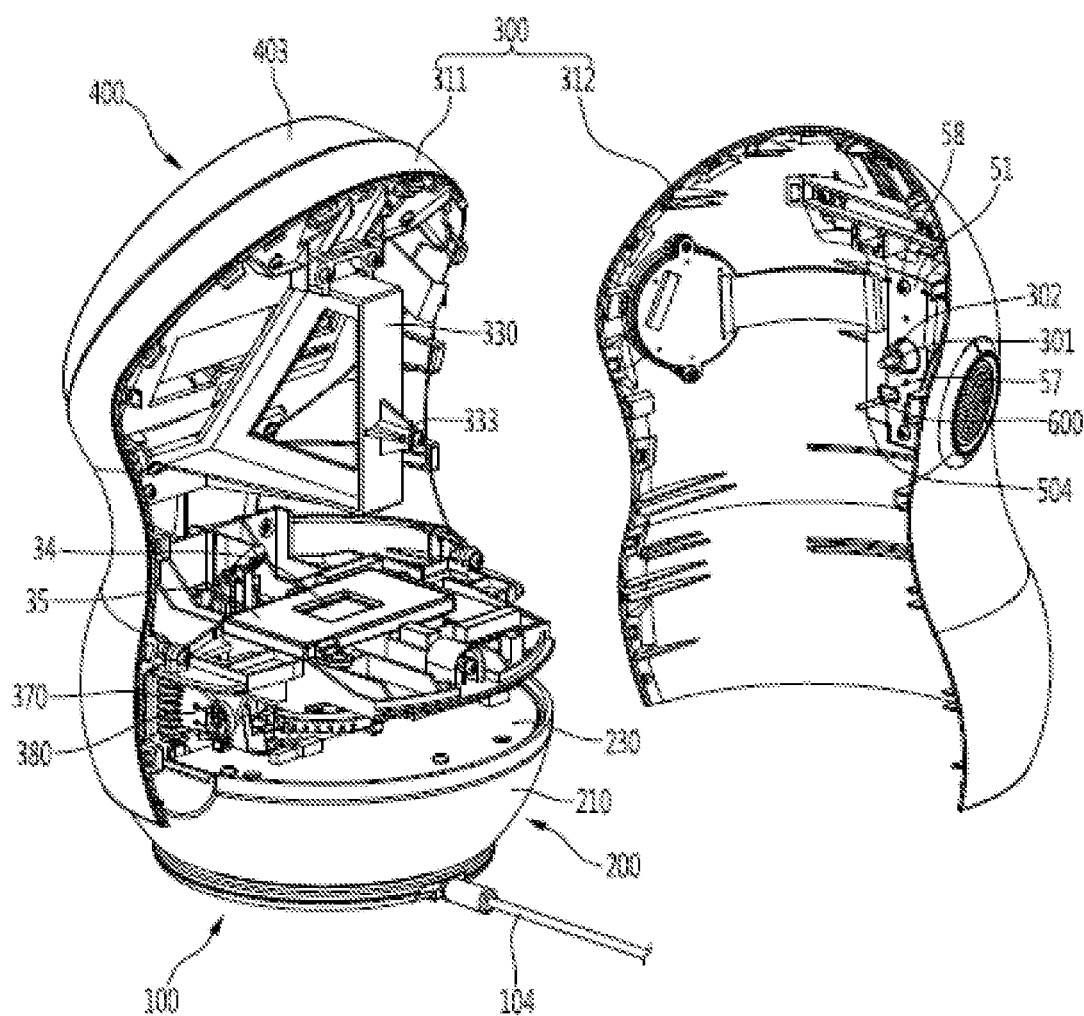

[Fig. 10]
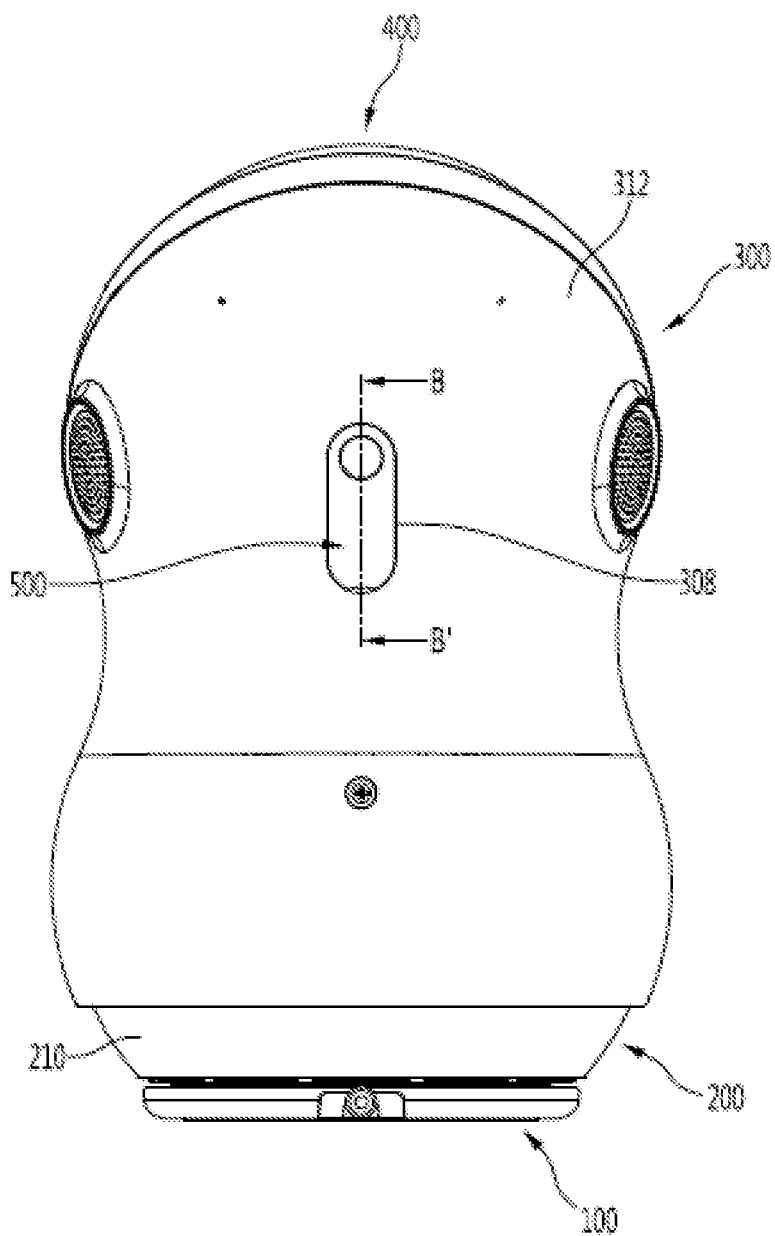

[Fig. 11]
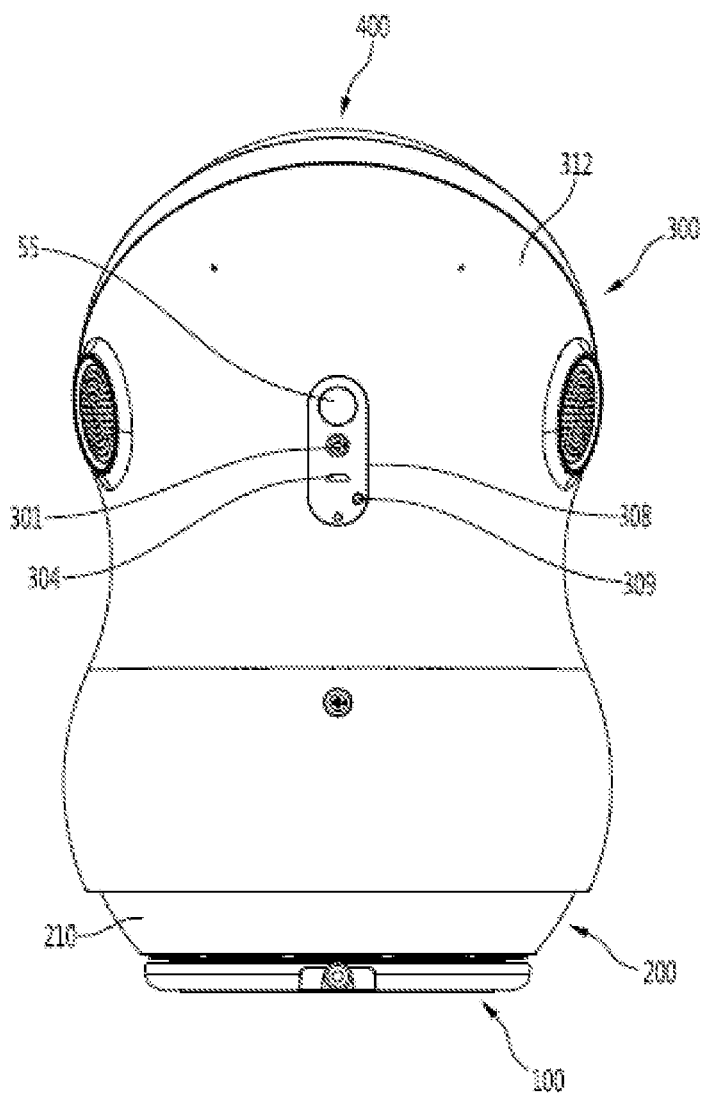

【Fig. 12】
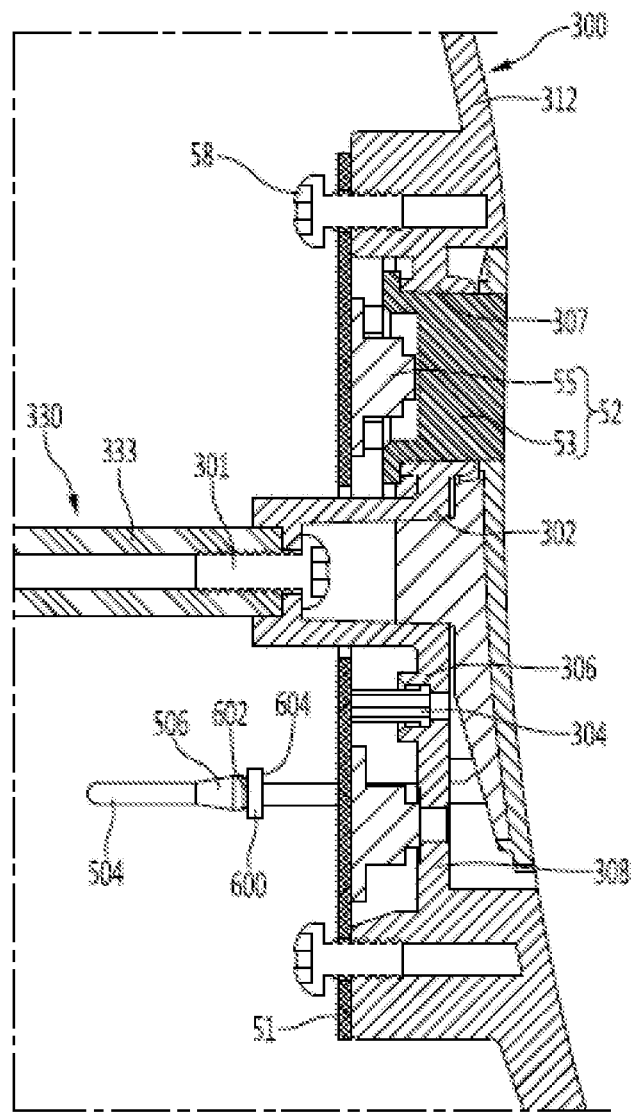

[Fig. 13]
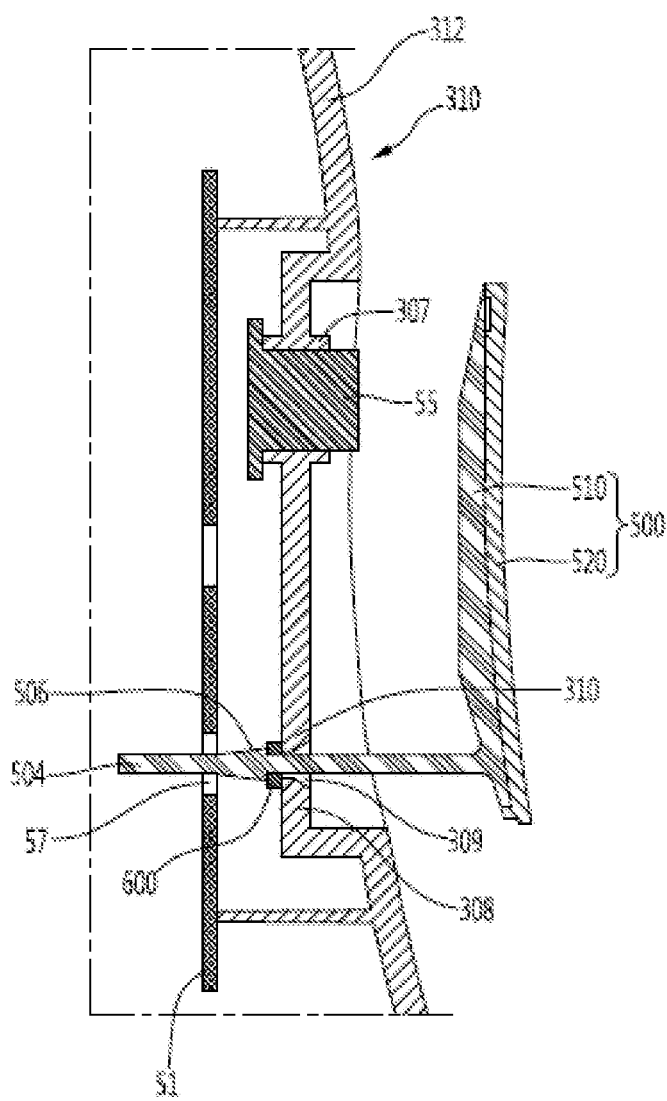

【Fig. 14】
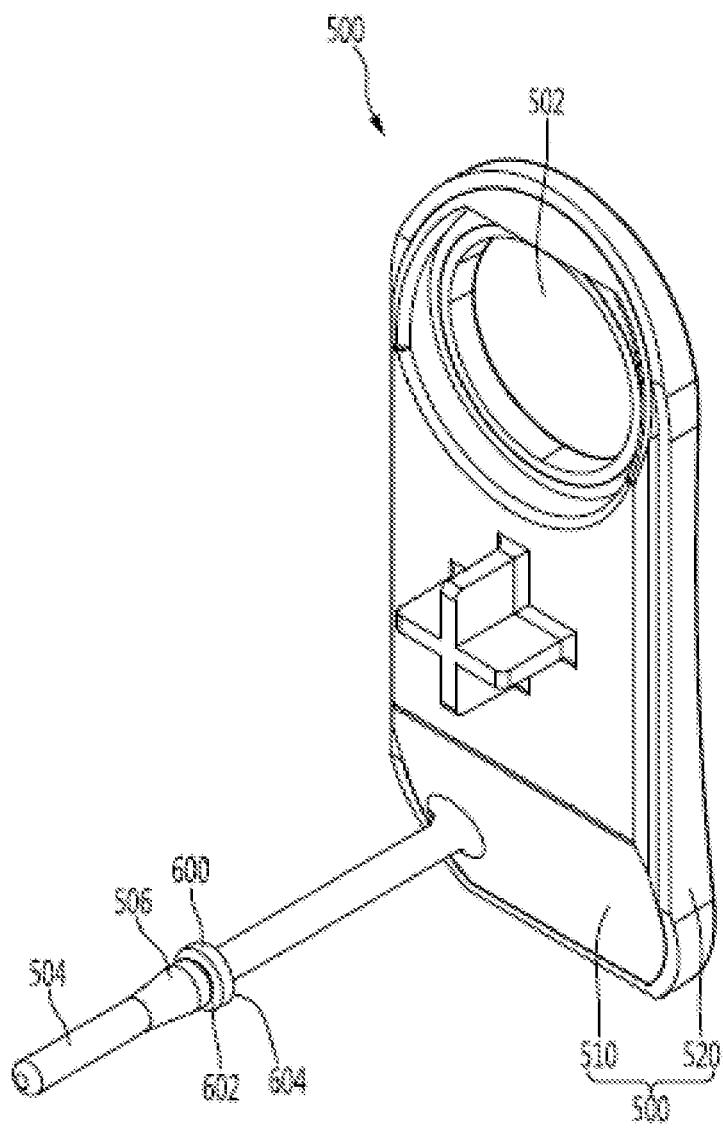

ROBOT WITH THROUGH-HOLE TO RECEIVE PIN

CROSS-REFERENCE TO RELATED PATENT APPLICATIONS

This application is a U.S. National Stage Application under 35 U.S.C. § 371 of PCT Application No. PCT/KR2019/002903, filed Mar. 13, 2019, whose entire disclosures are hereby incorporated by reference.

TECHNICAL FIELD

The present disclosure relates to a robot.

BACKGROUND ART

Robots are machines that automatically process given tasks or operate with their own capabilities. The application fields of robots are generally classified into industrial robots, medical robots, aerospace robots, and underwater robots. Recently, communication robots that can communicate with humans by voices or gestures have been increasing.

The robot may include an interface such as a display for providing visual or auditory information to a user.

Such a robot may include an outer body that forms an appearance, and the outer body may spin or tilt in a specific motion.

The robot is preferably configured such that a fastening member such as a screw or various components are not visible from the outside as much as possible. In particular, the robot may include a separate cover to enhance the appearance. In this case, the appearance of the robot may be enhanced.

DISCLOSURE OF THE INVENTION

Technical Problem

An object of the present disclosure is to provide a robot that can minimize deformation or damage of an outer body.

Another object of the present disclosure is to enhance the appearance.

The other object of the present disclosure is to minimize loss of components.

Technical Solution

In one embodiment, a robot includes: an outer body in which a pin through-hole is formed; a cover from which a pin passing through the pin through-hole protrudes and in which a protrusion is formed at one side of the pin; and a stopper disposed at an outer circumference of the pin, wherein the stopper includes: a protrusion contact surface on which the protrusion is contacted and caught; and an outer body contact surface that is contacted and caught by a periphery of the pin through-hole in the outer body.

The robot may further include an inner frame fastened to the outer body by a fastening member.

The fastening member may face a surface of the cover from which the pin protrudes. The cover may cover the fastening member.

The robot may further include: a PCB coupled to the outer body; a switching element installed on the PCB; and a button switching the switching element.

The cover may be provided with a button hole surrounding an outer circumference of the button.

The PCB may be provided with an avoidance hole avoiding the pin.

The outer body may be provided with a button accommodation portion accommodating the button. The button accommodation portion may face a surface of the cover from which the pin protrudes. The cover may cover the button accommodation portion.

The robot may further include a cable terminal connected to the PCB.

The cable terminal may face a surface of the cover from which the pin protrudes. The cover may cover the cable terminal.

The stopper may have a ring shape.

An inner diameter of the stopper may be smaller than an outer diameter of the protrusion.

The cover may include: an inner cover in which the pin protrudes from one surface; and an outer cover covering an opposite surface of the one surface of the inner cover from which the pin protrudes.

The inner cover may be made of an elastic material. The stopper may be made of a metallic material.

Advantageous Effects

According to an embodiment, when a user or an operator pulls out part of a cover, a stopper is constrained around a pin penetration portion, and thus, part of a pin and the stopper remain inside the outer body, thereby minimizing the loss of the cover that may occur when the entire cover is completely separated from the outer body.

BRIEF DESCRIPTION OF THE DRAWINGS

FIG. 1 is a view illustrating an example of a network system to which a robot according to an embodiment is applied.

FIG. 2 is a perspective view of a robot according to an embodiment.

FIG. 3 is a control block diagram of the robot according to the embodiment.

FIG. 4 is a front view of the robot according to the embodiment.

FIG. 5 is a side view illustrating a state in which an outer body according to an embodiment is tilted forward.

FIG. 6 is a side view illustrating a state in which the outer body according to the embodiment is tilted rearward.

FIG. 7 is an exploded perspective view of the robot according to the embodiment.

FIG. 8 is a cross-sectional view taken along line A-A of FIG. 4.

FIG. 9 is a perspective view illustrating a state in which the outer body according to the embodiment is disassembled.

FIG. 10 is a rear view of the robot according to the embodiment.

FIG. 11 is a rear view of the robot when a cover illustrated in FIG. 10 is not mounted.

FIG. 12 is a cross-sectional view taken along line B-B' of FIG. 10.

FIG. 13 is a cross-sectional view illustrating a state in which part of the cover is pulled out rearward and the cover is caught by a stopper, according to an embodiment.

FIG. 14 is a perspective view of the cover according to the embodiment.

BEST MODE

Hereinafter, specific embodiments of the present disclosure will be described in detail with reference to the accompanying drawings.

FIG. 1 is a view illustrating an example of a network system to which a robot according to an embodiment is applied.

As illustrated in FIG. 1, the network system to which the robot is applied may include a robot 1 that transmits information via a wired network or a wireless network, accessories 2, 3a, and 3b, a gateway 4, a terminal 6, an access point 7, and a server 8.

The network may be established based on technologies such as Wi-Fi, Ethernet, Zigbee, Z-wave, or Bluetooth. The robot 1, the accessories 2, 3a, and 3b, the gateway 4, and the access point 7 may include a communication module connectable to the network according to a predetermined communication protocol.

A communication module included in each of the devices 1, 2, 3a, 3b, 4, and 7 constituting the network system may be determined according to the configuration of the network, and a plurality of communication modules may be provided in the device according to a communication method between each device and the network or between the devices.

The robot 1 may be connected to the access point 7 via a wired (e.g., Ethernet) or wireless (e.g., Wi-Fi) communication. Communication between the robot 1 and the accessories 2 and 3b may be achieved via the gateway 4 and the access point 7. As another example, communication between the robot 1 and the accessory 3a or between the other devices 5 may be achieved via the access point 7.

Specifically, a signal transmitted from the accessories 2 and 3b may be transmitted to the robot 1 via the gateway 4 and the access point 7 in sequence, and a signal transmitted from the robot 1 may be transmitted to the accessories 2 and 3b via the access point 7 and the gateway 4 in sequence. As another example, a signal transmitted from the accessory 3a or other device 5 may be transmitted to the robot 1 via the access point 7, and a signal transmitted from the robot 1 may be transmitted to the accessory 3a or other device 5 via the access point 7.

For example, information acquired by sensor modules of the accessories 2, 3a, and 3b may be transmitted to the server 8, the terminal 6, or the robot 1 via the network. In addition, a signal transmitted from the server 8, the robot 1, or the terminal 6 so as to control the sensor module, a control module, or a remote control module may be transmitted to the accessory 2. The transmission of such signals may be performed via the gateway 4 and/or the access point 7.

Communication between the accessories 2, 3a, and 3b and the robot 1 is possible just by the gateway 4 and the access point 7. For example, even when a home network is disconnected from an external communication network such as the Internet, communication between the accessories 2, 3a, and 3b and the robot 1 is possible.

When the robot 1 is connected to the server 8 via the access point 7, information transmitted from the robot 1 or the accessory 2 may be stored in the server 8. The information stored in the server 8 may be received by the terminal 6 connected to the server 8.

In addition, the information transmitted from the terminal 6 may be transmitted to the robot 1 or the accessory 2 via the server 8. Since a smart phone, which is a recently widely used terminal, provides a convenient user interface (UI) based on graphics, it is possible to control the robot 1 and/or the accessory 2 via the UI or to process and display information received from the robot 1 and/or the accessory 2. In addition, functions that can be implemented through the robot 1 and/or the accessory 2 may be extended by updating applications installed on the smart phone.

Meanwhile, the terminal 6 and the robot 1 may directly communicate with each other regardless of the server 8. For example, the robot 1 and the terminal 6 may directly communicate with each other by using a Bluetooth scheme.

Meanwhile, it is also possible to control the accessory 2 or display and to process the information received from the accessory 2 with the robot 1 alone, without using the terminal 6.

The network system may be configured without the gateway 4, and the robot 1 may also function as the gateway 4.

The accessories 2, 3a, and 3b may include at least one communication module for connection with the network. The communication module may communicate with a predetermined network.

The accessories 2, 3a, and 3b may include a sensor module for detecting a predetermined ambient environment. The accessories 2, 3a, and 3b may include a control module that performs a specific function that affects the surrounding environment. The accessories 2, 3a, and 3b may include a remote control module that transmits an optical signal (for example, an infrared signal) for controlling a predetermined peripheral device.

The accessories 2, 3a, and 3b with the sensor module may be devices including a pressure sensor, a humidity sensor, a temperature sensor, a radiation detection sensor, a heat detection sensor, a gas detection sensor, an air quality sensor, an electronic nose sensor, a healthcare sensor, a biometric sensor, a sleep sensor (for example, the sleep sensor is attached to a user's pajamas or underwear to detect snoring, apnea, tossing, etc. while the user is sleeping), a proximity sensor, an illuminance sensor, an acceleration sensor, a magnetic sensor, a gravity sensor, a gyroscope sensor, a motion sensor, an RGB sensor, an infrared (IR) sensor, an ultrasonic sensor, a remote sensor, an SAR, a radar, and a light sensor (for example, a video sensor, an image sensor, etc.).

The accessories 2, 3a, and 3b with the control module may includes smart lighting for controlling illumination, a smart plug for controlling application and degree of power, a smart temperature regulator for controlling the operation and intensity of a boiler or an air conditioner, and a smart gas lock for controlling shutoff of gas.

The accessories 2, 3a, and 3b with the remote control module may include an infrared LED or the like for emitting an IR signal to a remote controllable household appliance or the like.

The accessories (for example, 3a and 3b) may be installed only for the purpose set to perform a predetermined performance. For example, the accessory 3a is a video camera, and the accessory 3b is a smart plug.

The accessory 2 according to the embodiment may be provided so as to be installed at any position desired by the user. In addition, the accessory 2 may be provided so as to be utilized for various purposes. For example, the accessory 2 may be attached to an external object such as a household appliance, a door, a window, or a wall.

The gateway 4 may mediate communication between one or more accessories 2 and 3b and the access point 7. The gateway 4 may communicate with the accessory 2 by wireless. The gateway 4 communicates with the access point 7 by wire or wireless. For example, the communication between the gateway 4 and the access point 7 may be based on Ethernet or Wi-Fi.

The access point 7 may be connected to the server 8 via wired or wireless communication. The server 8 maybe connected via the Internet. The access point 7 may communicate with the server 8 through various terminals 6 connected to the Internet. The terminal 6 may be a mobile terminal such as a personal computer (PC) or a smart phone.

The accessories 2 and 3b may be provided so as to communicate with the gateway 4. As another example, the accessory 3a may be provided so as to directly communicate with the access point 7 without passing through the gateway 4.

The access point 7 may be provided so as to directly communicate with the accessory 3a or other device 5 equipped with the communication module without passing through the gateway 4. These devices 5 and 3a are preferably provided with a Wi-Fi communication module so as to directly communicate with the access point 7 without passing through the gateway 4.

FIG. 2 is a perspective view of a robot according to an embodiment, FIG. 3 is a control block diagram of the robot according to the embodiment, FIG. 4 is a front view of the robot according to the embodiment, FIG. 5 is a side view illustrating a state in which an outer body according to an embodiment is tilted forward, and FIG. 6 is a side view illustrating a state in which the outer body according to the embodiment is tilted rearward.

The robot may include a base 100 and an outer body 300. The robot may include a driver 60 that performs motion of the robot. The driver 60 may be connected to the outer body 300 to perform a three-dimensional motion of the outer body 300.

The driver 60 may be disposed on the base 100 and supported by the base 100. The driver 60 may rotate and tilt the outer body 300. The driver 60 may rotate the outer body 300, may tilt the outer body 300, and may tilt the outer body 300 while rotating the outer body 300.

The driver 60 may include a spin body 200 disposed on the base 100 to be spinable, a spin mechanism 250 for rotating the spin body 200, and a tilting mechanism 350 disposed on the spin body 200 and connected to the outer body 300 to tilt the outer body 300.

The spin mechanism 250 and the tilting mechanism 350 may be driven independently, may be driven simultaneously, and may cause the outer body 300 to perform a complex motion during simultaneous driving.

The spin mechanism 250 may cause the spin body 200 to rotate about the base 100. The spin body 200 may be disposed to rotate about a rotational axis OS extending in the vertical direction, and the spin mechanism 250 may rotate the spin body 200 about the rotational axis OS.

The tilting mechanism 350 may tilt the outer body 300 about a tilting shaft OT. The outer body 300 may be disposed to be tilted about the tilting shaft OT extending in the horizontal direction. The tilting mechanism 350 may tilt the outer body 300 such that the outer body 300 is inclined to one side with respect to the spin body 200.

The tilting mechanism 350 may be mounted on the spin body 200. When the spin body 200 is rotated by the spin mechanism 250, the tilting mechanism 350 and the outer body 300 may rotate together with the spin body 200.

The robot may include at least one interface 42, 44, 54, and 56 installed on at least one of the spin body 200 or the outer body 300.

The robot 1 may include a controller 20 for controlling the robot 1. The controller 20 may be provided in the server 8 or the terminal 6 so as to control the robot 1 through the network.

The robot 1 may include a communication module 22 for communicating with the network. The communication module 22 may include a Wi-Fi module, a Bluetooth module, a Zigbee module, and a Z-wave module. The communication module 22 may be changed according to a communication scheme of a device to be directly communicated.

The communication module 22 may communicate with at least one of the access point 7, the gateway 4, the accessories 2, 3a, and 3b, the server 8, or the terminal 6 constituting the network system.

Information acquired from the input unit 50 through the communication module 22 may be transmitted over the network. Information may be received by the robot 1 on the network through the communication module 22, and the controller 20 may control the output unit 40 or the driver 60 based on the received information.

The robot 1 may further include a storage 24 for storing information acquired through a driving detector 70. The storage 24 may store information received from the network through the communication module 22. The storage 24 may store commands inputted from the input unit 50.

The robot 1 includes a power supply device 30 for supplying power to the respective components of the robot 1. The power supply device 30 may include a power connection portion 32 capable of connecting an external wired power cable. The power connection portion 32 may be implemented by a socket. The power supply device 30 may include a battery 34. The battery 34 may be provided for charging. The power supply device 30 may further include a charging module, e.g., a wireless charging module 36 capable of charging the battery 34.

The robot 1 may include the output unit 40. The output unit 40 may output the information to the outside visually or audibly.

The output unit 40 includes a display 42 for outputting information visually. The output unit 40 may include a speaker 44 for outputting information audibly.

The robot 1 may include the input unit 50. The input unit 50 may receive a command for controlling the robot 1. The input unit 50 may be configured to allow a user to directly input a command without passing through the communication module 22. The input unit 50 may receive a command for controlling the accessory 2.

The input unit 50 may include a switch 52. The switch 52 may include a power switch for turning on/off the power of the robot 1. The switch 52 may include a function switch for setting the function of the robot 1, pairing with a predetermined network, pairing with the terminal 6, and the like. It is possible to preset various commands to the robot 1 through a combination of the pressing time of the function switch and/or the number of times of continuously pressing the function switch. The switch 52 may include a reset switch capable of resetting a predetermined setting of the robot 1. The switch 52 may include a sleep switch for switching the robot 1 to a power-saving state or a non-output state.

The input unit 50 may include a sensor, e.g., a camera 54 for sensing an external visual image. The camera 54 may acquire an image for recognizing a user. The camera 54 may acquire an image for recognizing the direction of the user. Image information acquired by the camera 54 may be stored in the storage 24.

The input unit 50 may include a touch type display.

The input unit 50 includes a microphone 56 for sensing an external sound. When the robot 1 is provided with the microphone 56, the controller 20 of the robot 1 may recognize the user's voice inputted through the microphone 56 and extract a command. In order to recognize the position of the sound source, the input unit 50 may include a plurality of microphones 56. The sound information acquired by the microphone 56 or the position information about the user may be stored in the storage 24.

The robot 1 may include a direction sensor for sensing the direction of the user with respect to the robot 1. The direction sensor may include the camera 54 and/or the plurality of microphones 56.

The robot 1 may give the same feeling as a living creature by performing the motion of the robot 1 together with the output contents of the display 42 of the robot 1 or the output contents of the speaker 44 of the robot 1. Just as the gesture (motion) or eye contact play a big role in human-human communication, the motion of the robot 1 by the driver 60 may efficiently recognize the output contents of the output unit 40 to the user. The motion of the robot 1 by the driver 60 may add emotional elements in the communication process between the user and the robot 1.

The robot 1 includes a driving detector 70 capable of detecting a current motion state of the driver 60. The driving detector 70 includes a spin angle detector 72 that senses a rotating angle of the spin body 200 about the rotational axis OS. When the robot 1 further includes the outer body 300 and the tilting mechanism 350, the driving detector 70 may include a tilting angle detector 76 that senses a rotating angle (inclined angle) of the outer body 300 about the tilting shaft OT with respect to the spin body 200.

The controller 20 may control the communication module 22 based on control information received from the input unit 50. The controller 20 may control the communication module 22 to store the information received from the network in the storage 24. The controller 20 may perform a control such that the information stored in the storage 24 is transmitted to the network via the communication module 22.

The controller 20 may receive control information from the input unit 50. The controller 20 may perform a control such that the output unit 40 outputs predetermined information. The controller 20 may perform a control such that the driver 60 operates together with the information output of the output unit 40.

For example, the controller 20 may recognize the user based on the image acquired by the camera 54, and may operate the output unit 40 and the driver 60 based on the recognition. When the recognized user matches a preset user, the controller 20 may display a smile image on the display 42 and operate the tilting mechanism 350 to tilt the outer body 300 in the vertical or horizontal direction.

As another example, the controller 20 may recognize the face position of the user based on the direction sensor, and may operate the output unit 40 and the driver 60 based on the recognition result. The controller 20 may display predetermined information on the display 42 and operate the spin mechanism 250 such that the display 42 operates to direct the user's face. The controller 20 may perform a control such that the spin body 200 rotates so as to switch the image output direction of the interface module 400 to the direction of the user detected by the direction sensor.

The controller 20 may control whether to operate the driver 60 based on the control information received from the network via the communication module 22. The controller 20 may control the driver 60 based on the control information received from the input unit 50. The controller 20 may control the driver 60 based on the control information stored in the storage 24.

The robot 1 may include a remote control module 80. The remote control module 80 may transmit an optical signal (e.g., an infrared signal) for controlling a predetermined peripheral device. The predetermined peripheral device may refer to a peripheral device capable of remote control. For example, the predetermined peripheral device may be a washing machine, a refrigerator, an air conditioner, a robot cleaner, a TV, and the like, which can be controlled by a remote controller. The remote control module 80 may include a light emitter for emitting a predetermined optical signal for controlling the predetermined peripheral device. For example, the light emitter may be an LED that emits infrared rays. The direction in which the remote control module 80 irradiates the optical signal may be changed according to the operation of the robot 1. In this manner, the optical signal irradiation direction of the remote control module 80 may be changed in the direction of the specific device requiring the remote control, so as to control the specific device by the optical signal.

The display 42, the speaker 44, the camera 54, and the microphone 56, which constitute the robot 1, may be interfaces for helping communication between the human and the robot 1, these interfaces may be mounted on the spin body 200 and may be rotatable together with the spin body 200 when the spin body 200 rotates, and these interfaces may be mounted on the outer body 300 and may be tilted together with the outer body 300 when the outer body 300 is tilted.

In the communication robot 1, the interfaces such as the display 42, the speaker 44, the camera 54, and the microphone 56 may be distributed in the spin body 200 and the outer body 300.

The robot 1 may include an interface module 400 including at least one of the interfaces such as the display 42, the speaker 44, the camera 54, or the microphone 56, and the interface module 400 may be mounted on the outer body 300, may spin together with the outer body 300 during the rotation of the spin body 200, and may tilt together with the outer body 300 during the tilting of the outer body 300.

The battery 34, the display 42, the speaker 44, the camera 54, the microphone 56, the spin mechanism 250, the tilting mechanism 350, and the like are preferably supported to the spin body 200 or the outer body 300 in consideration of the weights or sizes thereof, and are preferably arranged such that the entire center of gravity of the robot 1 is minimized.

FIG. 7 is an exploded perspective view of the robot according to the embodiment, and FIG. 8 is a cross-sectional view taken along line A-A of FIG. 4.

The base 100 may rotatably support the spin body 200 and may support the load transmitted from the spin body 200. When the robot further includes the outer body 300 and the interfaces, the loads of the outer body 300 and the interfaces may be transmitted to the base 100 through the spin body 200.

Hereinafter, the base 100 will be described in detail with reference to FIGS. 7 and 8.

The base 100 may include a combination of a plurality of members. The base 100 may include a lower base 101, and an upper base 102 disposed on the lower base 101.

A PCB accommodation space for accommodating a base PCB 103 may be formed in the base 100. The PCB accommodation space S1 may be formed between the lower base 101 and the upper base 102, or may be formed inside the upper base 102.

The base PCB 103 may be accommodated in the PCB accommodation space S1 formed in the base 100 and may be protected by the base 100.

The base PCB 103 may be directly connected to the power connection portion 32 to which the power cord 104 is connected, or may be connected to the power connection portion 32 through a separate wire.

A light source such as an LED may be disposed in the base PCB 103. In this case, the base 100 may function as a lighting device, and the base 100 may function as an interface for providing visual information to the outside.

The base 100 may further include a base decor member 110 through which light emitted from the light source such as the LED is transmitted.

The base 100 may further include a non-skid member 105 disposed on the bottom surface of the lower base 101. The non-skid member 105 may be formed in a ring shape or a disk shape, and may be attached to the bottom surface of the lower base 101. The non-slip member 105 may be a non-slip mat having a large frictional force with the ground.

The robot may include at least one rolling bearing 107. The rolling bearing 107 is installed on the base 100 to support the spin body 200.

The base 100 may include a bearing supporter 106 for supporting the rolling bearing 107.

The rolling bearing 107 may have an inner ring connected to the bearing supporter 106 through a support shaft, and the outer ring may rotate along the inner ring.

A plurality of rolling bearings 107 may be provided in the base 100. The plurality of rolling bearings 107 may support the spin body 200, particularly the spin housing 210, in a state of being spaced apart from the base 100.

The plurality of rolling bearings 107 may be disposed along a virtual circle, and the plurality of rolling bearings 107 may transmit the load acting on the spin body 200 to the base 100, particularly the bearing supporter 106 in a distributed manner.

A weight body W capable of increasing the weight of the base 100 may be disposed in the base 100. The weight body W is an object having a larger weight than a volume, and may reduce the entire center of gravity of the robot 1 as much as possible and help the robot 1 not to overturn. The weight body W may be disposed in the bearing supporter 106. A plurality of weight bodies W may be stacked in the vertical direction.

An upper bearing 108 for rotatably supporting the spin body 200 may be disposed in the base 100. The base 100 may further include a fixed shaft 109 on which the upper bearing 108 is mounted. The fixed shaft 109 may be a rotational center axis of the spin body 200, and the center axis of the fixed shaft 109 may be the rotational axis OS. The fixed shaft 109 may be disposed on the top side of the bearing supporter 106. The fixed shaft 109 may be coupled to the bearing supporter 106 by a fastening member such as a screw.

The upper bearing 108 may be mounted on the fixed shaft 109 so as to be disposed above the spin driven gear 280 to be described later. The upper bearing 108 may be disposed so as to surround the outer circumference of the upper portion of the fixed shaft 109.

The upper bearing 108 may be an upper rolling bearing disposed between the fixed shaft 109 and a spin cover 220 to be described later.

The upper bearing 108 may include an inner ring fixed to the outer circumference of the fixed shaft 109, an outer ring fixed to the upper bearing housing 221 formed in the spin cover 220, and a rolling member such as a ball or a roller disposed between the inner ring and the outer ring.

The upper bearing 108 may be disposed above the spin driven gear 280 and spaced apart from the spin driven gear 280, and may rotatably support the spin cover 220. The shaft center of the upper bearing 108 may be a vertical axis, and the shaft center of the upper bearing 108 may coincide with the rotational axis OS.

The spin driven gear 280 may be mounted on the fixed shaft 109, and the spin driven gear 280 may be mounted on the fixed shaft 109 by a fastening member such as a screw. The spin driven gear 280 may have a double structure of an upper gear and a lower gear, and the upper gear and the lower gear may be fixed to each other. The spin driven gear 280 may be guided to rotate the spin body 200 in a state of being fixedly mounted on the fixed shaft 109. The spin body 200 may be rotated along the locus of the spin driven gear 280.

A through-hole (H) through which a wire or the like can pass may be formed in the fixed shaft 109. The through-hole H may be formed to pass through the fixed shaft 109 in the vertical direction.

The wire or the like passing through the through-hole H of the fixed shaft 109 may connect the base PCB 103 to at least one of a PCB 230 mounted on the spin body 200, a PCB 36 mounted on the outer body 300, an interface PCB 406 of the interface module 400, or the battery 34.

Hereinafter, the spin body 200 will be described.

The spin body 200 may be supported to be spinable on the base 100. The spin body 200 may be mounted on the rolling bearing 107, and may spin about the fixed shaft 109 in a state of being mounted on the rolling bearing 107.

The spin body 200 may include a combination of a plurality of members, and the spin body 200 may include a spin housing 210 having a space S2 formed therein and a spin cover 220 covering the space S2.

At least one interface may be accommodated in the space S2 of the spin body 200. The interface may be a speaker 44 accommodated in the spin body 200. The speaker 44 may be disposed below the spin cover 220 and may be protected by the spin cover 220, and the spin housing 210 and the spin cover 220 may function as a protective cover that protects the speaker 44. The spin body 200 may be an interface housing that protects the interface accommodated in the space S2.

Part of the spin housing 210 may be exposed to the outside. Part of the spin housing 210 may be seen through the lower end of the outer body 300, and the spin housing 210 may constitute part of the appearance of the robot.

The spin housing 210 may have a shape in which the top surface thereof is opened and the size thereof is reduced downward. The outer surface of the spin housing 210 may be convex toward the outside.

The spin housing 210 may include an outer hollow body 211 and an inner hollow body 213.

The outer hollow body 211 may have a space S2 in which the speaker 44 can be accommodated, and the size of the outer hollow body 211 may be reduced toward the lower side.

The inner hollow body 213 may extend from the lower end of the outer hollow body 211 toward the space S2 formed inside the outer hollow body 211.

A base through-hole 212 through which part of the base 100 passes may be formed at the center of the inner hollow body 213.

The spin cover 220 may have a plate shape as a whole, or may be mounted on the upper end of the spin housing 210. The spin cover 220 may be inserted into the spin housing 210 and coupled to the spin housing 210 inside the spin housing 210.

Tilting shaft supporters 240 and 242 (FIG. 7) for rotatably supporting the tilting shaft OT may be disposed on the spin cover 220. The tilting shaft supporters 240 and 242 may be disposed on the top surface of the spin cover 220. The pair of tilting shaft supporters 240 and 242 may be arranged so as to be spaced apart in the horizontal direction, and the tilting shaft OT may be rotatably supported to the tilting shaft supporters 240 and 242 through the bearing 241.

The robot may further include the PCB 230 (see FIGS. 7 and 8) disposed on the top surface of the spin cover 220. The PCB 230 may be smaller than the spin cover 220 and may cover part of the top surface of the spin cover 220. The PCB 230 may be horizontally disposed on the top surface of the spin cover 220. The PCB 230 may be a rotation PCB mounted on the spin cover 220 and rotated together with the spin cover 220.

The PCB 230 may control at least one electrical component mounted on the spin cover 220. For example, the PCB 230 may be a motor control PCB for controlling the spin motor 260 and the tilting motor 360.

Hereinafter, the spin mechanism 250 will be described.

The spin mechanism 250 may be connected to the spin body 200 and rotate the spin body 200.

The spin mechanism 250 includes a spin motor 260, a spin driving gear 270, and a spin driven gear 280.

The spin motor 260 may be disposed in the spin cover 220, and the driving shaft may protrude from the lower portion of the spin motor 260.

The spin motor 260 may be disposed on the top surface of the spin cover 220. The spin motor 260 may be fastened to the spin cover 220 by a fastening member such as a screw. The driving shaft of the spin motor 260 may be vertically disposed below the spin motor 260. The driving shaft of the spin motor 260 may protrude toward the space S2.

The spin cover 220 may be provided with a vertical through-hole through which at least one of the driving shaft of the spin motor 260 or the spin driving gear 270 passes. At least one of the driving shaft of the spin motor 320 or the rotational shaft of the spin driving gear 270 may be disposed in the through-hole of the spin cover 220.

The spin driving gear 270 may be engaged with the driving shaft of the spin motor 260 in the space S2. The spin driving gear 270 may be rotated inside the spin body 200 and may be protected by the spin body 200. The spin driving gear 270 may be suspended from the driving shaft of the spin motor 260. The spin driving gear 270 may be rotated by the spin motor 250 below the bottom surface of the spin cover 220.

The spin driven gear 280 may be fixed to the base 100. The spin driven gear 280 may be a fixed gear that is fixedly mounted to the fixed shaft 109 of the base 100.

In the spin mechanism 250, the spin driving gear 270 may be engaged with the spin driven gear 280. In this case, the spin driving gear 270 may be rotated while revolving along the outer circumference of the spin driven gear 280.

In the spin mechanism 250, the spin driving gear 270 is not directly engaged with the spin driven gear 280, and the spin driving gear 270 and the spin driven gear 280 may be connected via the spin intermediate gear 290 (see FIG. 7).

The spin intermediate gear 290 may be rotatably connected to the spin cover 220. The spin cover 200 may be provided with an intermediate gear support shaft for rotatably supporting the spin intermediate gear 290. The intermediate gear support shaft may protrude downward from the bottom surface of the spin cover 220. The spin intermediate gear 290 may be accommodated in the space S2 of the spin body 200 like the spin driving gear 290.

The spin intermediate gear 290 may transmit power between the spin driving gear 270 and the spin driven gear 280. The spin intermediate gear 290 may revolve along the outer circumference of the spin driven gear 280.

Hereinafter, the outer body 300 will be described.

The outer body 300 may be formed to be larger than the spin housing 210. The bottom surface of the outer body 300 may be opened. An upper space S3 may be formed inside the outer body 300. The upper space S3 may be a space in which the tilting base 320 is accommodated.

The outer body 300 may include a combination of a plurality of members, and may include a plurality of bodies that are disposed in a longitudinal or vertical direction and coupled to each other.

The outer body 300 may include a first outer body 311 on which an interface module 400 is mounted, and a second outer body 312 coupled to the first outer body 311, and the upper space S3 may be formed between the first outer body 311 and the second outer body 312.

When the first outer body 311 is a front outer body, the second outer body 312 may be a rear outer body coupled to the rear end of the first outer body 311. When the first outer body 311 is a left outer body, the second outer body 312 may be a right outer body coupled to the right end of the first outer body 311.

The outer body 300 may be provided with an opening 313 (see FIG. 8) on which the interface module 400 is mounted. The interface module 400 may be inserted into the opening 313 and disposed in the opening 313.

The opening 313 of the outer body 300 may be formed in the first outer body 311. In this case, the first outer body 311 may be a front housing facing the human so as to communicate with the human.

Hereinafter, the tilting mechanism 350 will be described.

The tilting mechanism 350 may include a tilting base 320.

The tilting base 320 may be protected by the outer body 300 in a state of being accommodated in the upper space S3 of the outer body 300. The tilting base 320 may be connected to the tilting shaft OT and rotated together with the tilting shaft OT. A tilting shaft connection portion 321 (see FIG. 7), to which the tilting shaft OT is connected, may be formed in the tilting base 320. The tilting shaft connection portion 321 may elongate in the horizontal direction at the lower portion of the tilting base 320.

The tilting shaft OT may be elongated in the tilting base 320 in the horizontal direction.

The tilting shaft OT may be connected to the tilting base 320, and the tilting base 320 may be coupled to the outer body 300. During the rotation of the tilting shaft OT, the tilting base 320 and the outer body 300 may tilt while rotating together about the tilting shaft OT. The tilting base 320 and the outer body 300 may constitute a tilting body that can tilt the interface module 400.

A tilting base connection portion 314 (see FIG. 8), to which the tilting base 320 is coupled, may be formed on the inner surface of the outer body 300. The connection portion 324 (see FIG. 8), into which the tilting base connection portion 314 is inserted and fitted, may be formed in the tilting base 320.

The tilting base connection portion 314 may include a pair of ribs spaced apart from each other by an interval corresponding to the thickness of the connection portion 324 such that the connection portion 324 is inserted and fitted thereinto.

The connection portion 324 may be formed at part of the outer circumference of the tilting base 320 and may be inserted between one pair of ribs.

The outer body 300 may be provided with a tilting base 320 and a tilting base mounter 315 (see FIG. 8) fastened by a fastening member such as a screw. The tilting base 320 may be provided with a fastening portion 325 (see FIG. 8) fastened to the tilting base mounter 315 by a fastening member such as a screw.

The tilting base mounter 315 may protrude from the outer body 300 toward the upper space S3.

The fastening portion 325 may include a fastening boss to which the fastening member such as the screw is fastened. The fastening portion 325 may be formed on an opposite side of the tilting base 320 to the connection portion 324.

The tilting base 320 may be disposed across the upper space S3 formed inside the outer body 300.

The tilting base connection portion 314 and the tilting base mounter 315 may be formed on the inner lower portion of the outer body 300. In this case, the tilting base 320 may be disposed across the inner lower portion of the outer body 300, and the lower strength of the outer body 300 may be reinforced.

In the robot, the battery 34 may be mounted on at least one of the base 100, the spin body 200, the outer body 300, or the interface module 400.

The battery 34 is preferably mounted in a configuration that is relatively low in height among the configurations of the robot and can be disposed on the rotational shaft OS. To this end, the battery 34 may be disposed on the tilting base 320. The tilting base 320 may be provided with a pocket into which the battery 34 is inserted and accommodated. The battery cover 35 (see FIG. 8) may be coupled to the tilting base 320 so as to prevent the battery 34 accommodated in the pocket from being removed.

A connecting PCB 36 may be disposed in the tilting base 320. The connecting PCB 36 may be connected to at least one of the PCB 230 or the base PCB 103 mounted on the spin cover 230 by wires, and may be connected to at least one of the PCB 340 mounted on the outer body 300 and the interface PCB 406 of the interface module 400 by wires.

The tilting mechanism 350 may include a tilting motor 360, a tilting driving gear 370 connected to the tilting motor 360, and a tilting driven gear 380 connected to the tilting shaft OT or the tilting base 320 and engaged with the tilting driving gear 370.

The tilting motor 360 may be disposed below the spin cover 220 and accommodated in the space S2.

The tilting driving gear 370 may elongate in a direction intersecting with the tilting shaft OT.

The tilting driven gear 380 may be disposed above the spin cover 220, and the tilting motor 360 and the tilting driven gear 380 may be connected through the tilting driving gear 370, with the spin cover 220 disposed therebetween.

A through-hole through which at least one of the driving shaft of the tilting motor 360 or the tilting driving gear 370 passes may be formed in the spin cover 220 in the vertical direction. At least one of the driving shaft of the tilting motor 360 or the rotational shaft of the tilting driving gear 370 may be disposed in the through-hole of the spin cover 220.

The spin cover 220 may be provided with a tilting motor fastening portion to which the tilting motor 360 is fastened. The tilting motor 360 may be fastened to the tilting motor fastening portion disposed below the spin cover 220. The tilting motor 360 may be fastened to the spin cover by a fastening member such as a screw. The tilting motor fastening portion may be a fastening boss or a fastening hole formed in the spin cover 220.

The driving shaft of the tilting motor 360 may be disposed in a direction intersecting with the tilting shaft OT. The tilting shaft OT may extend in the horizontal direction, and the tilting motor 360 may be mounted on the spin cover 220 with the driving shaft extending in the vertical direction.

The tilting driving gear 370 may be rotated by the tilting motor 360. The tilting driving gear 370 may be a worm gear disposed vertically. The worm gear that is the tilting driving gear 370 may be vertically disposed on the tilting cover 210 in a state of being connected to the tilting motor 360.

The tilting driven gear 380 may be a spur gear that rotates about the tilting shaft OT. The tilting driven gear 380 may be connected to at least one of the tilting shaft OT or the tilting base 320 so as to tilt the tilting body 320.

The tilting driven gear 380 may be connected to the tilting body 320 so as to rotate the tilting base 320 about the tilting shaft OT.

The tilting driven gear 380 may include a tilting base fastening portion that can be fastened to the tilting base 320 by a fastening member such as a screw.

The robot may further include a gear supporter 390 mounted on the spin cover 220 and supporting the tilting driving gear 360.

The spin cover 220 may be provided with a gear supporter fastening portion to which the gear supporter 390 is fastened. The gear supporter 390 may be fastened to the spin cover 220 by a fastening member such as a screw, and the gear supporter fastening portion may be a fastening boss or a fastening hole formed in the spin cover 220.

Meanwhile, the display 42, the camera 54, and the microphone 56 may be mounted on the outer body 300 or the interface module 400 and rotated together with the outer body 300 during the rotation of the spin body 200, and may be tilted together with the outer body 300 during the tilting of the tilting body 300.

The interface module 400 may include interfaces other than the interfaces accommodated in the space S2, and may include the display 42, the camera 54, the microphone 56, and the like.

Referring to FIG. 8, the interface module 400 may include an interface case 403 mounted on the outer body 300 and having openings 401 and 402 formed therein, a front cover 404 disposed on the front surface of the interface case 403 and covering the openings 401 and 402, and a back cover 405 coupled to the interface case 403.

The back surface of the interface case 403 may be opened, and the openings 401 and 402 may be formed on the front surface of the interface case 403.

The front cover 404 may cover the front surface of the interface case 404.

The back cover 405 may be disposed inside the interface case 403 and may be fastened to the interface case 403 by a fastening member such as a screw.

The interface module 400 may further include an interface PCB 406 disposed in the back cover 405.

The display 42 constituting the interface of the present disclosure may be disposed between the interface PCB 406 and the front cover 404 to constitute the interface module 400. All or part of the display 42 may be accommodated in one opening 401 among the openings 401 and 402 and may output an image through the front cover 404.

Meanwhile, the camera 54 constituting the interface of the present disclosure may be disposed between the back cover 406 and the front cover 404. All or part of the camera 54 may be accommodated in the other opening 402 among the openings 401 and 402 and may capture an image through the front cover 404.

Meanwhile, the robot may further include an inner frame 330 supporting the outer body 300. The inner frame 330 reinforces the strength of the outer body 300. The strength of the outer body 300 may be reinforced by connecting weak portions of the outer body 300 to each other.

The strength of the outer body 300 around the opening 313 may be relatively weak and the inner frame 330 may connect the periphery of the opening 313.

When the opening 313 is formed in the first tilting housing 311, the inner frame 330 preferably connects the upper periphery of the opening 313 and the lower periphery of the opening 313 in the first tilting housing 311. In addition, the inner frame 330 is preferably connected to the upper portion of the second tilting housing 312.

The inner frame 330 may have a polygonal shape, and may be disposed in the upper space S3 of the outer body 300 to function as a frame for supporting the outer body 300.

The inner frame 330 may be disposed on the tilting base 320. In this case, the tilting base 320 may be a lower reinforcing member for reinforcing the lower strength of the outer body 300, and the inner frame 330 may be an upper reinforcing member for reinforcing the upper strength of the outer body 300.

The outer body 300 may be fastened to the inner frame 330 by the fastening member 301. The fastening member 301 may be a pin or a screw.

The robot may include a PCB 51 disposed in the outer body 300 and a switch 52 installed on the PCB 51.

The PCB 51 may be fastened to the outer body 300 and may be an outer body PCB that spins or tilts together with the outer body 300.

The switch 52 may include a switching element 53 installed on the PCB 52 and a button 55 for switching the switching element 53.

The button 55 may be accommodated in the outer body 300, and a button accommodation portion 307 for accommodating the button 55 may be formed in the outer body 300.

The robot may further include a cable terminal 304. The cable terminal 304 may be connected to the PCB 51. The robot may be updated or charged by a cable connected to the cable terminal 304. The cable terminal 304 may be disposed in the outer body 300.

The robot may include a cover 500 or a cap covering at least one of the fastening member 301, the cable terminal 304, or the button accommodation portion 307.

The cover 500 may cover all of the fastening member 301, the cable terminal 304, and the button accommodation portion 307 such that the fastening member 301, the cable terminal 304, and the button accommodation portion 307 are not visible from the outside, and may enhance the appearance of the robot.

The cover 500 may be provided with a button hole 502 surrounding the outer circumference of the button 55. The cover 500 may be a button deco surrounding the outer circumference of the button 55 around the button 55.

FIG. 9 is a perspective view illustrating a state in which the outer body according to the embodiment is disassembled, FIG. 10 is a rear view of the robot according to the embodiment, FIG. 11 is a rear view of the robot when a cover illustrated in FIG. 10 is not mounted, FIG. 12 is a cross-sectional view taken along line B-B' of FIG. 10, FIG. 13 is a cross-sectional view illustrating a state in which part of the cover is pulled out rearward and the cover is caught by a stopper, according to an embodiment, and FIG. 14 is a perspective view of the cover according to the embodiment.

The PCB 51 may be fastened to the outer body 300 by a fastening member such as a screw. The PCB 51 may be fastened around a fastening member penetration portion 302, a cable terminal accommodation portion 306, or the button accommodation portion 307.

The PCB 51 may be provided with an avoidance hole 57 to avoid the pin 504 to be described later.

The switching element 53 may be installed on the surface of the PCB 51 facing the button 55.

The button 55 may be disposed to be movable in the button accommodation portion 307 formed in the outer body 300.

The outer body 300 may be provided with the fastening member penetration portion 302 through which the fastening member 301 fastened to the inner frame 330 passes.

The fastening member 301 may be inserted into the fastening member penetration portion 302 from the outside of the outer body 300, and may be fastened to the fastening portion 333 formed in the inner frame 320.

The fastening member 301 and the fastening member penetration portion 302 may face the surface of the cover 500 from which the pin 504 protrudes, and may be hidden by the cover 500.

The outer body 300 may be provided with a cable terminal accommodation portion 306 in which the cable terminals 304 is accommodated.

The cable terminal accommodation portion 306 may be disposed close to the fastening member penetration portion 302. The cable terminal accommodation portion 306 may be formed spaced apart from the fastening member penetration portion 302 around the fastening member penetration portion 302.

The button accommodation portion 307 formed in the outer body 300 may be formed spaced apart from the fastening member penetration portion 302 and the cable terminal accommodation portion 306 around the fastening member penetration portion 302 and the cable terminal accommodation portion 306. The button accommodation portion 307 may face the surface of the cover 500 from which the pin 504 protrudes, and may be hidden by the cover 500.

All or part of the cable terminal 304 may be accommodated in the cable terminal accommodation portion 306, and the cable terminal 304 and the cable terminal accommodation portion 306 may face the surface of the cover 500 from which the pin 504 protrudes.

The outer body 300 may be provided with a recessed portion 308 recessed toward the inner side of the outer body 300.

The fastening member penetration portion 302, the cable terminal accommodation portion 306, and the button accommodation portion 307 may be formed in the recessed portion 308. The recessed portion 308 may be formed in a stepped shape on one side of the outer body 300.

The cover 500 may be disposed to cover the recessed portion 308. The cover 500 may be inserted into the recessed portion 308, and the cover 500 may cover the fastening member 301 and the cable terminal 304 together.

If necessary, the user or operator may take part of the cover 500 out of the recessed portion 308 as illustrated in FIG. 13. If necessary, the user or operator may loosen the fastening member 301 or may connect the cable to the cable terminal 304.

When the cover 500 is completely separated from the outer body 300, the possibility of loss is high. The cover 500 may include a holder that may hold part of the cover 500 in the outer body 300. The holder may be formed in a structure in which part of the cover 500 is caught by the outer body 300.

The cover 500 may include a protruding pin 504, and a pin through-hole 309 (see FIG. 13) through which the pin 504 passes may be formed in the outer body 300.

A protrusion 506 may be formed at one side of the pin 504. The protrusion 506 may be formed to protrude radially on the outer circumference of the pin 504, the outer diameter of the protrusion 506 may be larger than the outer diameter of the portion of the pin 504 where the protrusion 506 does not protrude.

The cover 500 may include an inner cover 510 protruding from one surface of the pin 504, and an outer cover 520 covering the opposite side of the surface of the inner cover 510 from which the pin 504 protrudes.

The inner cover 510 may be made of an elastic material such as rubber, such that the pin 504 can be bent. When the stopper 600 to be described later is caught on the inner surface of the outer body 300, the pin 504 may be partially retained inside the outer body 300 together with the stopper 600, and the pin 504 is not released to the outside of the outer body 300.

The outer cover 520 may protect the inner cover 510 and may be made of a harder material than the inner cover 510. The outer cover 510 may be the same material or the same color as that of the outer body 300.

The robot may include a stopper 600 that prevents any separation of the cover 500.

The stopper 600 may be disposed at the outer circumference of the pin 504. The stopper 600 may include a protrusion contact surface 602 and an outer body contact surface 604.

The stopper 600 may have a ring shape. The inner diameter of the stopper 600 may be smaller than the outer diameter of the protrusion 506.

The protrusion contact surface 602 is the surface of the stopper 600 facing the protrusion 506, and may be the surface on which the protrusion 506 is contacted and caught.

The outer body contact surface 604 is the surface opposite to the protrusion contact surface 602, and may be the surface that is contacted and caught by the periphery 310 of the pin through-hole 309 in the outer body 300.

The stopper 600 may be disposed between the surface of the inner cover 510 from which the protrusion 506 protrudes and one end of the protrusion 506. The outer body contact surface 604 may contact the periphery 310 of the pin through-hole 309 when the cover 500 is partially pulled out.

The pin 504 may include a first pin portion protruding from the inner cover 510, a second pin portion extending from the first pin portion in the longitudinal direction of the pin 504 and having the protrusion 506 formed at the outer circumference thereof, and a third pin portion extending from the second pin portion in the longitudinal direction of the pin 504.

The stopper 600 may be disposed at the outer circumference of the first pin portion. When stopper 600 is disposed at the outer circumference of the first pin portion, the protrusion contact surface 602 may be contacted with and caught by the protrusion 506, or the outer body contact surface 604 may be contacted with and caught by the periphery 310 of the pin through-hole 309.

The stopper 600 may be formed of a size and a material that can be maintained without being bent or deformed when the stopper 600 is caught by the outer body 300. For example, the stopper 600 may be made of a ring of a metal such as steel or SUS.

The above description is merely illustrative of the technical idea of the present disclosure, and various modifications and changes may be made thereto by those skilled in the art without departing from the essential characteristics of the present disclosure.

Therefore, the embodiments of the present disclosure are not intended to limit the technical spirit of the present disclosure but to describe the technical idea of the present disclosure, and the technical spirit of the present disclosure is not limited by these embodiments.

The scope of protection of the present invention should be interpreted by the appending claims, and all technical ideas within the scope of equivalents should be construed as falling within the scope of the present invention.

The invention claimed is:

1. A robot comprising:
an outer body in which a pin through-hole is formed, the outer body being provided with an opening, and a space being formed inside the outer body;
a cover from which a pin passing through the pin through-hole protrudes and in which a protrusion is formed at one side of the pin;
a stopper disposed at an outer circumference of the pin;
an interface module disposed in the opening, the interface module comprising a display; and
an inner frame disposed in the space;
wherein the inner frame connects a periphery of the opening and supports the outer body,
wherein the inner frame is fastened to the outer body by a fastening member, and
wherein the stopper comprises:
a protrusion contact surface on which the protrusion is contacted and caught; and
an outer body contact surface that is contacted and caught by a periphery of the pin through-hole in the outer body.

2. The robot according to claim 1, wherein
the fastening member faces a surface of the cover from which the pin protrudes, and
the cover covers the fastening member.

3. The robot according to claim 1, further comprising:
a PCB coupled to the outer body;
a switching element installed on the PCB; and
a button switching the switching element.

4. The robot according to claim 3, wherein the cover is provided with a button hole surrounding an outer circumference of the button.

5. The robot according to claim 3, wherein the PCB is provided with an avoidance hole avoiding the pin.

6. The robot according to claim 3, wherein
the outer body is provided with a button accommodation portion accommodating the button,
the button accommodation portion faces a surface of the cover from which the pin protrudes, and
the cover covers the button accommodation portion.

7. The robot according to claim 1, further comprising:
a PCB coupled to the outer body; and
a cable terminal connected to the PCB.

8. The robot according to claim 7, wherein
the cable terminal faces a surface of the cover from which the pin protrudes, and
the cover covers the cable terminal.

9. The robot according to claim 1, wherein
the stopper has a ring shape, and
an inner diameter of the stopper is smaller than an outer diameter of the protrusion.

10. The robot according to claim 1, wherein the cover comprises:
an inner cover in which the pin protrudes from one surface; and
an outer cover covering an opposite surface of the one surface of the inner cover from which the pin protrudes.

11. The robot according to claim 10, wherein
the inner cover is made of an elastic material, and
the stopper is made of a metallic material.

12. A robot comprising:
an outer body in which a pin through-hole is formed, the outer body being provided with an opening, and a space being formed inside the outer body;
a cover from which a pin passing through the pin through-hole protrudes and in which a protrusion is formed at an outer circumference of the pin;
a stopper disposed to move along the outer circumference of the pin between the protrusion and the outer body;
an interface module disposed in the opening, the interface module comprising a display; and
an inner frame disposed in the space;
wherein the inner frame connects a periphery of the opening and supports the outer body,
wherein the inner frame is fastened to the outer body by a fastening member, and
wherein the stopper comprises:
  a protrusion contact surface on which the protrusion is contacted and caught; and
  an outer body contact surface that is contacted and caught by a periphery of the pin through-hole in the outer body.

13. The robot according to claim 12,
wherein the outer body is provided with a fastening member penetration portion through which the fastening member fastened to the inner frame passes,
wherein the fastening member and the fastening member penetration portion face a surface of the cover from which the pin protrudes, and
wherein the cover covers the fastening member and the fastening member penetration portion.

14. The robot according to claim 12, further comprising:
a PCB coupled to the outer body;
a switching element installed on the PCB; and
a button switching the switching element,
wherein the cover is provided with a button hole surrounding an outer circumference of the button.

15. The robot according to claim 14, wherein
the outer body is provided with a button accommodation portion accommodating the button,
the button accommodation portion faces a surface of the cover from which the pin protrudes, and
the cover covers the button accommodation portion.

16. The robot according to claim 12, further comprising:
a PCB coupled to the outer body; and
a cable terminal connected to the PCB,
wherein
the cable terminal faces a surface of the cover from which the pin protrudes, and
the cover covers the cable terminal.

17. The robot according to claim 12, wherein the cover comprises:
an inner cover in which the pin protrudes from one surface; and
an outer cover covering an opposite surface of the one surface of the inner cover from which the pin protrudes,
wherein the inner cover is made of an elastic material, and
wherein the outer cover is made of a harder material than the inner cover.

18. A robot comprising:
an outer body in which a pin through-hole is formed, the outer body being provided with an opening, and a space being formed inside the outer body;
a PCB coupled to the outer body;
a cable terminal connected to the PCB;
a cover from which a pin passing through the pin through-hole protrudes and in which a protrusion is formed at an outer circumference of the pin, the cover covering the cable terminal;
a stopper disposed to move along the outer circumference of the pin between the protrusion and an inner surface of the outer body;
an interface module disposed in the opening, the interface module comprising a display; and
an inner frame disposed in the space;
wherein the inner frame connects a periphery of the opening and supports the outer body,
wherein the inner frame is fastened to the outer body by a fastening member,
wherein the stopper is contacted and caught by a periphery of the pin through-hole in the outer body when the cover is pulled out from the outer body,
wherein the cover comprises:
  an inner cover in which the pin protrudes from one surface; and
  an outer cover covering an opposite surface of the one surface of the inner cover from which the pin protrudes,
wherein the inner cover is made of an elastic material, and
wherein the outer cover is made of a harder material than the inner cover.

19. The robot according to claim 18, wherein the PCB is provided with an avoidance portion avoiding the pin.

20. The robot of claim 19, wherein the avoidance portion of the PCB includes a hole to receive a distal section of the pin, and a diameter of the hole is greater than an outer diameter of the stopper.

* * * * *